United States Patent [19]

Metzger et al.

[11] Patent Number: 5,635,284
[45] Date of Patent: Jun. 3, 1997

[54] MONOCHROME AND POLYCHROME COLOR PROOFS WITH LOW OPTICAL DOT GROWTH AND A PROCESS AND MEANS FOR THEIR PREPARATION

[75] Inventors: Bernhard Metzger, Darmstadt; Ursula A. Kraska, Weiterstadt; Mario Grossa, Dreieich, all of Germany

[73] Assignee: E. I. Du Pont de Nemours and Company, Wilmington, Del.

[21] Appl. No.: 323,302

[22] Filed: Oct. 14, 1994

[30] Foreign Application Priority Data

Nov. 2, 1993 [DE] Germany .................. 43 37 379.8
Mar. 31, 1994 [DE] Germany .................. 44 11 224.6

[51] Int. Cl.⁶ ........................................ B32B 9/00
[52] U.S. Cl. ................. 428/195; 428/143; 428/204; 428/206; 428/411.1; 428/476.1; 428/511; 428/513; 428/516; 428/518; 428/537.5; 428/917; 430/143; 430/176; 430/292
[58] Field of Search ............... 428/143, 917, 428/511, 513, 195, 204, 206, 516, 411.1, 518, 537.5, 476.1; 430/176, 143, 292, 66, 96, 99, 253, 257, 263, 158

[56] References Cited

U.S. PATENT DOCUMENTS

| | | | |
|---|---|---|---|
| 3,582,327 | 6/1971 | Boyd et al. | 96/28 |
| 3,620,726 | 11/1971 | Chu et al. | 96/27 R |
| 3,649,268 | 3/1972 | Chu et al. | 96/27 R |
| 3,909,282 | 9/1975 | Gray | 106/288 Q |
| 4,145,480 | 3/1979 | Kusama et al. | 428/513 |
| 4,215,193 | 7/1980 | Manger et al. | 430/291 |
| 4,243,741 | 1/1981 | Abele et al. | 430/270 |
| 4,262,071 | 4/1981 | Larson | 430/11 |
| 4,346,162 | 8/1982 | Abele | 430/270 |
| 4,356,253 | 10/1982 | Buzzell | 430/291 |
| 4,579,810 | 4/1986 | Johnson et al. | 430/293 |
| 4,604,340 | 8/1986 | Grossa | 430/270 |
| 4,806,451 | 2/1989 | Frohlich | 430/291 |
| 4,889,787 | 12/1989 | Musser | 430/166 |
| 4,892,802 | 1/1990 | Bauer et al. | 430/270 |
| 4,948,704 | 8/1990 | Bauer et al. | 430/291 |
| 5,075,196 | 12/1991 | Daems et al. | 430/202 |
| 5,176,973 | 1/1993 | Gifford et al. | 430/15 |

FOREIGN PATENT DOCUMENTS

| | | | |
|---|---|---|---|
| 0 186 194 | 7/1986 | European Pat. Off. | G03F 3/10 |
| 0 305 599 | 3/1989 | European Pat. Off. | G03F 3/10 |
| 0 420 675 A3 | 4/1991 | European Pat. Off. | G03F 3/10 |
| 1 210 321 | 2/1966 | Germany . | |
| 0 523 325 A1 | 6/1991 | Germany | G03F 7/28 |
| 0 639 796 A1 | 2/1995 | Germany | G03F 3/10 |
| 945807 | 1/1964 | United Kingdom . | |
| 1339045 | 11/1973 | United Kingdom | B44D 1/16 |
| 93/15272 | 8/1993 | WIPO | D21H 21/54 |

*Primary Examiner*—Patrick Ryan
*Assistant Examiner*—Abraham Bahta

[57] ABSTRACT

Monochrome and polychrome color proofs, for the graphic arts industry, having an image carrier containing two layers A and B to control optical dot growth are described. Layer A contains at least one polyolefin and, in a preferred embodiment, a light-reflecting white pigment. Layer B contains at least one binder, at least one light-reflecting white pigment at between 50% and 90% by weight relative to Layer B, and at least one light-absorbing pigment. A process and a means for preparing such monochrome and polychrome color proofs are described.

5 Claims, No Drawings

MONOCHROME AND POLYCHROME COLOR PROOFS WITH LOW OPTICAL DOT GROWTH AND A PROCESS AND MEANS FOR THEIR PREPARATION

FIELD OF THE INVENTION

This invention concerns a process for preparing color proofs used in the graphic arts industry. More particularly, this invention concerns a process for preparing a color proof having an image carrier, which, as a constituent of the proof, controls optical dot growth in the process. The invention also concerns recording materials for proofing processes in the graphics arts industry. Such materials contain the image carrier.

BACKGROUND OF THE INVENTION

Halftone color separations are used in reprography as copy originals for preparing offset or letterpress printing plates. Before the printing plates are exposed, the color separations are inspected with the aid of a color proofing process to determine whether the ultimate printing result will be a tonally accurate reproduction of the original.

Such proofing processes use radiation-sensitive recording materials on which an image is produced by differences in the tackiness of exposed and unexposed areas of the radiation- sensitive layer. For example, German patent DE-C 12 10 321; U.S. Pat. Nos. 3,620,726; 3,582,327; 3,649,268; 4,356,253; 4,892,802; and 4,948,704 disclose a reproduction process in which a tacky photopolymerizable recording material, comprising a support and a photopolymerizable layer having at least one addition-polymerizable monomer and a photopolymerization initiator, is hardened by imagewise exposure, causing the exposed image areas to lose their tackiness.

The latent image is made visible by the application of suitable toners that adhere only on the unexposed tacky areas and can be removed, after application, from the exposed nontacky image areas. This process yields positive, optionally colored images of the original. These images resemble in appearance the images that would be produced by printing inks.

Negative images of the original are obtained by using the photosensitive materials described in U.S. Pat. Nos. 4,243, 741; 4,346,162; and 4,604,340. The photosensitive components in these recording materials are either a dihydropyridine compound or a system of a dihydropyridine compound and a hexaaryl bisimidazole compound.

The toners, which comprise predominantly finely divided powders, are applied by dusting them on the imagewise exposed surface, as described, for example, in U.S. Pat. Nos. 4,215,193 and 3,909,282. In another embodiment, the toner can be loosely bonded on a special support and transferred by bringing this support into contact with the imagewise exposed layer. Such pigmented support layers are described in U.S. Pat. No. 4,806,451 and DE-C 39 41 493.

The radiation-sensitive recording materials usually comprise a support, a radiation-sensitive layer, and a cover sheet. This cover sheet is stripped off and the material is laminated on an image support before imagewise exposure. The support can be stripped off before or after exposure, depending on the material.

The printing process causes mechanical dot growth. This dot growth must obviously be taken into account in a color proofing process to assure a tonally accurate reproduction in the ultimate printing result.

The processes described in DE-C 12 10 321; U.S. Pat. Nos. 3,620,726; 4,243,741; 4,346,162; 4,604,340; 3,582, 327; 3,649,268; 4,356,253; 4,892,802; and 4,948,704 produce optical dot growth due to the thickness of the photopolymerizable layers. This corresponds to mechanical dot growth in conventional printing processes.

The development of modern planographic printing processes has reduced mechanical dot growth. However, the above-described color proofing processes are still limited in their capability for making a tonally accurate reproduction of the ultimate printing result in modern planographic printing processes.

Therefore, the graphic arts industry demands color proofing processes with especially low optical dot growth for modern planographic printing.

Optical dot growth is reduced, as discussed in U.S. Pat. No. 4,889,787, by reducing the thickness of a transparent auxiliary layer that is proximate to the radiation-sensitive layer. Another possibile approach to reducing optical dot growth in color proofing processes, is to use titanium dioxide in a first layer laminated on an image carrier, as described in U.S. Pat. No. 5,176,973. The layer containing titanium dioxide can be applied either alone as the topmost layer on the image carrier or together with the first radiation-sensitive layer on the image-side surface of the image carrier.

Color proofing processes using image carriers with low optical dot growth are described in U.S. Pat. Nos. 4,579,810 and 5,075,196. The latter discloses using a layer comprising titanium dioxide and a hydrophilic colloidal binder on a paper base coated with a polyolefin.

U.K. Patent 13 39 045 describes a support for photographic emulsions with two layers on the image-side surface and having an inorganic white pigment essentially only in the outer layer.

However, all of these developments are inadequate for the low dot growth required in the above-described color proofing processes.

Therefore, a problem involved in this invention is to propose monochrome and polychrome color proofs having low optical dot growth and a means and process for their preparation. The radiation-sensitive layer of the radiation-sensitive recording material will remain unchanged to preserve its utility in color proofing processes with a standard optical dot growth in the range between 19% and 25% for a 50% dot.

SUMMARY OF THE INVENTION

This invention is directed to monochrome and polychrome color proofs having an image carrier comprising (a) a substrate having an image-side surface, (b) a Layer A containing a polyolefin between the image-side surface of the substrate, (c) at least one layer bearing a coloring agent; and (d) a Layer B containing at least one light-absorbing pigment, at least one light-reflecting white pigment, and at least one binder. Layer B is situated between Layer A and the layer(s) bearing the coloring agents.

In another embodiment, the invention is directed to a process for making color proofs comprising:

(a) applying to an image carrier, a radiation-sensitive recording layer present on a transparent support wherein the radiation-sensitive layer is in contact with the image carrier;

(b) exposing imagewise the radiation-sensitive layer through the support thereby producing areas that are tacky and areas that are nontacky;

(c) stripping off the support; and (d) applying a toner to the tacky areas of the exposed layer.

In still another embodiment, the invention is directed to a process for making color proofs comprising:

(a) applying to an image carrier, after removal of the protective layer, a radiation-sensitive recording material present on a transparent support, said image carrier having Layer A on the image-side surface so that the radiation-sensitive recording layer is in contact with the image receptor surface of the image carrier;

(b) exposing imagewise the radiation-sensitive recording layer through the support thereby producing areas that are tacky and areas that are nontacky;

(c) stripping off the support; and (d) applying a toner to the tacky areas of the exposed layer.

In still another embodiment, the invention is directed to an image carrier for making color proofs, said image carrier having a substrate with the Layer A firmly bonded to its image-side surface and Layer B placed on Layer A.

The invention also concerns a radiation-sensitive recording material used to prepare monochrome and polychrome proofs by a color proofing process, said material comprising, in order:

(a) a transparent support;

(b) a radiation-sensitive layer;

(c) a Layer B; and (d) a protective layer, where Layer B is present between the protective layer and the radiation-sensitive layer.

DETAILED DESCRIPTION OF THE INVENTION

Examples of suitable polyolefins for the polyolefin-containing Layer A present in the monochrome and polychrome color proofs of the invention (hereinafter called Layer A) are high density or low density polyethylene, polypropylene, their mixtures, and copolymers prepared essentially by using ethylene or propylene.

In a preferred embodiment, Layer A contains a light-reflecting white pigment, which further reduces optical dot growth. The presence of a light-reflecting white pigment in Layer A makes the corresponding image carrier especially good for preparing monochrome and polychrome color images by color proofing processes for high quality printing.

The quantity of light-reflecting white pigment in Layer A is at most 20% by weight relative to the total weight of Layer A.

The maximum thickness of Layer A is 100 µm. A preferred thickness is less than 60 µm, the range between 5 µm and 40 µm being particularly preferred.

Layer B contains (a) at least one light-absorbing pigment, (b) at least one light-reflecting white pigment, and (c) at least one binder (hereinafter called Layer B). Suitable light-reflecting white pigments for Layer A and Layer B are the anatase and rutile forms of titanium dioxide, barium sulfate, mica coated with titanium dioxide, or their mixtures. The anatase or rutile forms of titanium dioxide are especially suitable.

The weight per unit area of Layer B is 5 g/m$^2$ to 25 g/m$^2$. The range from 10 g/m$^2$ to 20 g/m$^2$ is preferred. A weight per unit area of 13 g/m$^2$ to 17 g/m$^2$ is the most suitable.

The weight proportion of light-reflecting pigment in Layer B is between 50% and 90% relative to Layer B.

Examples of suitable light-absorbing pigments for Layer B are black pigments, such as carbon black, synthetic iron oxide black, graphite, and ivory jet black. Carbon black is particularly preferred.

Examples of suitable binders for Layer B are ethylene/vinyl acetate copolymers, polyesters, and polymers and copolymers of vinyl chloride, acrylonitrile, acrylates, vinyl acetate, styrene, and butadiene.

Layer B can be applied during the preparation of the image carrier after the application of Layer A as another layer on the image-bearing side of the image carrier. Thus, Layer A is closer than Layer B to the substrate of the image carrier.

Layer B can also be applied on the side of the image carrier bearing Layer A after the preparation of the image carrier and before the application of the radiation-sensitive layer.

Alternatively, Layer B can also be applied on the image carrier with the radiation-sensitive layer as an additive layer in the radiation-sensitive material after the removal of the cover sheet. The radiation-sensitive material to be used thus contains the Layer B between the cover sheet and the radiation-sensitive layer.

In this case, the corresponding color proofing process uses an image carrier that contains only the Layer A on the image-bearing side of the image carrier and optionally, other layers on the surface of the image-bearing side.

Layer B can be applied as an aqueous dispersion on the appropriate base and then dried.

The monochrome and polychrome color proofs of the invention can also have a Layer C between Layer B and the radiation-sensitive layer.

Layer C contains a binder that is at least one suitable polymer and/or copolymer. The polymer and/or copolymer can comprise, for example, acrylates, methacrylates, vinyl esters, butadiene, isoprene, ethylene, propylene, vinylidene chloride, vinyl alkyl ethers, and other ethylenically unsaturated compounds. Layer C can also optionally contain plasticizers and surfactants.

Binders especially suitable for Layer C are polymers and/or copolymers comprising at least 80% by weight of ethylenically unsaturated compounds, such as butadiene, ethylene, propylene, vinylidene chloride, and/or isoprene.

Layer C reduces the development of variations in color density during the preparation of monochrome and polychrome color proofs. This property of Layer C is especially important in the use of radiation-sensitive layers less than 6 µm thick for making monochrome and polychrome proofs.

Suitable thicknesses for Layer C are in the range of 0.5 µm to 10 µm. An especially preferred embodiment has a Layer C between 1 µm and 5 µm thick.

Other functions of Layer C can be, for example, to promote adhesion between an image carrier and the first laminated layer and to be a barrier against the diffusion of organic molecules, such as, for example, ethylenically unsaturated compounds in the radiation-sensitive layer of the radiation- sensitive recording material.

Layer C can be applied, for example, on Layer B during or after preparation of an image carrier bearing Layers A and B. It can be applied as an aqueous suspension of the appropriate polymer components, which can contain, in addition to the polymer components, other compounds, such as, for example, surfactants or plasticizers. It can be applied as the topmost layer on the image carrier and then dried.

Commercial polymer suspensions, such as, for example, DIOFAN 195D manufactured by BASF, can be used to prepare Layer C.

Layer C can also be contained in radiation-sensitive materials for color proofing processes as or in addition to bonding or tacky layers or thermoplastic adhesive layers. Examples of such materials are described in DE-A 41 25 723, EP-A 04 20 675, (U.S. Pat. No. 5,176,973), EP-A 03 39 860 (U.S. Pat. No. 4,889,787), and EP-A 05 14 186

If such a radiation-sensitive material contains Layer B, Layer C is located between Layer B and the radiation-sensitive layer.

Tonable radiation-sensitive mixtures within the concept of this invention include positive tonable, photohardenable systems, such as, for example, those disclosed in DE-C 12 10 321, U.S. Pat. Nos. 3,620,726 or 3,649,268 and negative tonable systems that become tacky on exposure, such as, for example, disclosed in U.S. Pat. Nos. 4,243,741, 4,346,162, and 4,604,340. The negative tonable recording materials contain either a dihydropyridine compound or a photosensitive system of a hexaaryl bisimidazole compound and a dihydropyridine.

Positive tonable, photopolymerizable recording materials are preferred for practicing this invention. Specifically, the materials described in U.S. Pat. Nos. 4,734,356 and 4,849,322 and U.S. Pat. Nos. 4,892,802 and 4,948,704 are preferred. These materials contain a polymeric binder, at least one photopolymerizable compound, a photoinitiator, and optionally, added auxiliaries, such as, plasticizers, sensitizers, fillers, antioxidants, and optical brighteners. Preferred binders are the polymers disclosed in U.S. Pat. Nos. 4,892,802 and 4,948,704, with a glass temperature greater than 70° C., or greater than 80° C. for polymer mixtures, and with salt-forming groups, which are crosslinked ionically through metal ions. Thermoplastic binders based on acrylate and/or methacrylate containing salt-forming groups, for example, as acrylic acid or methacrylic acid, have proved especially useful. The preferred metal ions are magnesium, calcium, strontium, barium, aluminum, tin, zinc, cadmium, titanium, zirconium, and manganese, which are added as the salt, preferably as chelates.

The tonable, radiation-sensitive mixtures can be applied by known methods onto suitable, preferably transparent supports, and then dried. Examples of suitable supports are synthetic resin sheets of polyethylene, polypropylene, polyamide, and polyester. A polyethylene terephthalate sheet is preferred.

If an opaque support is used, it is stripped off before imagewise exposure.

The side of the recording layer away from the support is provided with a flexible cover sheet, for example, a thin sheet of polystyrene, polyethylene, polypropylene, or polyethylene terephthalate. A polypropylene sheet is preferred.

The recording layer is preferably between 2 µm and 0.1 mm thick.

The radiation sensitive materials are most sensitive in the UV range, preferably in the wavelength range between 250 and 450 nm.

All radiation sources that deliver an effective amount of this radiation are suitable for exposure, for example, xenon lamps, mercury vapor lamps, carbon arc lamps, laser fluorescent lamps with phosphors that emit UV radiation, and electronic flash devices.

The imagewise exposed recording layer can be toned by dusting with toners comprising predominantly finely divided powders, as disclosed, for example, in U.S. Pat. Nos. 4,215,193 and 3,909,282, and also with pigmented toning sheets containing toner loosely bonded on a special support. Such toning sheets are described, for example, in DE-C 39 41 493; U.S. Pat. Nos. 4,806,451; and 4,902,363 and 4,939,029.

The invention is used mainly to prepare monochrome and polychrome proofs and in color proofing processes. Examples of such color proofing processes are described in U.S. Pat. No. 4,895,787; DE-A 42 09 873; U.S. Pat. No. 5,240,810; EP-A 04 87 797; DE-A 41 25 723; EP-A 05 14 186; U.S. Pat. Nos. 4,987,048; 3,671,236; 5,223,374; and 5,090,774.

Suitable substrates are supports, such as paper, cardboard, metals, and sheets or plates of polymers, such as, for example, polyethylene, polyester, polyvinyl chloride, and polyamide, which have at least the Layer A on the image-bearing side. If the color proofing process uses a radiation-sensitive recording material that does not have the Layer B, the substrate has Layer B and optionally, a bonding layer on Layer A. Paper is especially well suited.

The image carrier can otherwise be unmodified or can have additional coatings. Layers A, B, and C and other coatings on the image carrier can contain other compounds, such as pigments, fillers, optical brighteners, UV absorbers, and antistats, in addition to the invention's components and other conventional components.

Operating a color proofing process according to this invention can, for example, include the following steps.

After the cover sheet is stripped off, a positive tonable, photopolymerizable recording material is laminated on an image carrier, which bears Layer A, Layer B, and optionally, a bonding layer as the outermost layers of the side toward the image, so that the radiation-sensitive layer, whether polymerized or not, has greater adhesion to the surface of the image carrier than to its own support.

The material is exposed to actinic radiation through the transparent support with a halftone color separation positive of one color as the original to form nontacky areas. The support is removed by delamination. The latent image formed on the image carrier is made visible by the application of a toner that adheres exclusively to the unexposed areas. The toner is removed from the hardened image areas, which are then completely free of toner. A monochrome image corresponding to the original is obtained in this manner.

After its cover sheet is removed, a second laminate of the photopolymerizable material is laminated on the image, is exposed under the same conditions through a color separation positive of a second color, and toned. This step is repeated with a color separation of a third color, and if desired, with a black separation.

A four-color image corresponding to the original is thus obtained.

A protective layer can be applied on the monochrome or polychrome image. The protective layer comprises, for example, another laminate of photohardenable, radiation-sensitive material from which the support is removed after overall exposure.

When a negative tonable recording material that becomes tacky on exposure is used, the color proofing process is conducted in a similar manner, except that color separation negatives are used instead of color separation positives.

An alternative embodiment has a positive tonable, photopolymerizable recording material with the Layer B between the cover sheet and the radiation-sensitive layer. The cover sheet can be stripped off, and the recording material can be laminated on an image carrier bearing Layer A on the side toward the image and optionally coated with a bonding layer so that radiation-sensitive layer, whether polymerized or not, adheres more to the surface of the image carrier than to its own support. Further process steps are the same as in the previously described process.

With an appropriate selection of a binder and optionally, a plasticizer, Layer B can also function as a bonding layer.

EXAMPLES

The invention is illustrated by, but not limited to, the following examples.

Example 1

Two resin-coated image carriers A and B were prepared as follows. Image Carrier A comprised a paper substrate having on its image-bearing front side a composite coating of one layer of polyethylene and bonded over this layer, another layer comprising up to 20% of a binder mixture of 7.2 parts of polyacrylic ester/polystyrene copolymer, 1 part of a polyacrylic ester/polyvinyl acetate/acrylic acid copolymer, and 0.17 part of a polycarboxylic acid, and up to 80% of titanium dioxide powder. The weight per unit area of this layer was 15 g/m$^2$. The resin-coated Image Carrier B was made like A, but also contained 10% by weight of titanium dioxide powder in the first layer (polyethylene layer). Both resin-coated Image Carriers A and B were each coated with a 4 µm thick, positive working, tonable, photohardenable mixture, as described in U.S. Pat. Nos. 4,892,802 and 4,948,704 and exposed through a halftone original with actinic light in an exposure device. The original contained test fields with various surface coverages to determine dot growth. The exposure produced tacky and nontacky areas separated imagewise. The tacky areas were toned by means of a cyan color sheet. Another tonable photohardenable mixture was laminated four times successively on the cyan image layer and in each case, hardened by exposure to actinic light. The growth in the halftone dots of the cyan image, compared to the original was measured with a densitometer (GRETAG D186). Six fields with a surface coverage of 27% and 50% (in the exposure original) were each measured and averaged. The dot growth is the difference between the surface coverage in the original and the corresponding measurement value.

Two more resin-coated image carriers, C and D, were prepared. C was prepared like A and D was prepared like B. However, C and D also contained 0.002% by weight of a black pigment (Printex 300, DEGUSSA) in the second coating layer. The optical density of both Image Carriers C and D was 0.02, as measured with a densitometer (GRETAG D186 with a filter for black). A cyan image was produced on each of these image carriers and the dot growth was measured.

TABLE 1

| Image Carrier | % Dot Growth (50% dot) | % Dot Growth (27% dot) | Carbon Black in 2. Layer | TiO$_2$ in 1. Layer |
| --- | --- | --- | --- | --- |
| A (Comparison) | 21.5 | 21.3 | no | no |
| B (Comparison) | 21.0 | 20.0 | no | yes |
| C (Invention) | 18 | 16 | yes | no |
| D (Invention) | 17 | 15 | yes | yes |

The titanium dioxide powder added to the first coating layer (polyethylene layer) on Image Carrier B reduced the optical dot growth of a 50% dot by 0.5% and of a 27% dot by 1.3% compared to Image Carrier A.

The addition of black pigment in the second coating layer produced the invention's reduction in dot growth. A further reduction in the growth of the 50% dot to 17%, without adding more black pigment was obtained by the combination of the polyethylene layer containing titanium dioxide with the second coating layer containing black pigment and white pigment, as shown by Image Carrier D.

Example 2

A mixture of 50 g of TiO$_2$ powder, 13 g of a polyacrylic ester/polystyrene copolymer dispersion (50% solids content), 3 g of a polyacrylic ester/polyvinyl acetate/acrylic acid copolymer dispersion (40% solids content) and 0.15 g of a surfactant (polycarboxylic acid) was dispersed in 33 g of water. This dispersion was mixed with various quantities of a black pigment (Printex 300, DEGUSSA) and coated with a spiral doctor blade on the image-bearing side of a polyethylene-coated paper substrate so that the dry weight of the layer was 15 g/m$^2$. As described in Example 1, a cyan image was produced on the resulting image carrier, and the dot growth was measured.

TABLE 2

| Black Pigment (% by wt. in layer) | % Dot Growth (50% dot) | % Dot Growth (27% dot) | Optical Density |
| --- | --- | --- | --- |
| 0.00 | 23 | 22 | 0.00 |
| 0.01 | 18 | 16 | 0.05 |
| 0.05 | 16 | 15 | 0.18 |
| 0.10 | 16 | 13 | 0.21 |

The use of black pigment at 0.05% by weight, relative to the dry layer containing the black pigment, yielded the required low optical dot growth in the 50% dots. However, this material cannot be used for color proofing processes for high quality printing, because at 0.01% of black pigment, there is too much gray for a tonally accurate reproduction of the ultimate printing result.

Example 3

A layer containing the light-absorbing pigment and the light-reflecting white pigment of Example 1 on Image Carriers C and D was coated on the positive-working, tonable, photopolymerizable mixture according to U.S. Pat. Nos. 4,892,802 and 4,948,704. This modified radiation-sensitive material was laminated on Image Carrier B of Example 1. As in Example 1, a cyan image was produced on the resulting image carrier and the dot growth was measured. The cyan image and the optical dot growth of the resulting cyan image did not differ from the cyan image, and its optical dot growth respectively, as produced in Example 1 using Image Carrier D.

Example 4

A recording material and pigmented transfer layers of cyan, magenta, yellow, and black colors, as disclosed in Example 12 of DE-C 39 31 493, were used to make a polychrome color proof. After its cover sheet was removed, a 4 µm thick, positive-working, tonable, photohardenable mixture was laminated on an image carrier like Image Carrier D of Example 1. The composite structure was exposed through a halftone positive cyan color separation in a vacuum copy frame with a metal halide lamp (3,000 watts) with an ultraviolet-transparent filter for 42 seconds at a distance of 95 cm. After removal of the support, the cyan transfer sheet was laminated on the imagewise exposed layer and immediately stripped off. The transfer layer remained adhered only on the unexposed tacky areas, producing a positive cyan image of the original.

After its cover sheet was removed, a second 4 µm thick, positive-working, tonable, photohardenable mixture was laminated on the cyan image and exposed as above through the corresponding halftone magenta color separation. After removal of the support, the magenta transfer layer was laminated on the imagewise exposed layer and stripped off. The transfer layer remained adhered only on the unexposed, tacky areas, producing a positive magenta image. The operation was repeated for yellow and black. A protective layer was applied in the usual manner. A four-color proof having outstanding brilliance and sharpness was obtained with a resolution of 1% to 99% on the 60 lines/cm screen, representing a faithful reproduction of the original. The adhesion of the recording layers on the resin-coated image carrier was outstanding. The resulting polychrome color image had the required low dot growth.

Example 5

An Image Carrier E was prepared by coating on the image-side surface of an Image Carrier D of Example 1 an aqueous dispersion of a copolymer of vinylidene chloride (90% by weight) and methyl acrylate (10% by weight) with the aid of a spiral doctor blade. The coated product was dried at 60° C. to yield a 3 µm thick Layer C. The aqueous dispersion contained 25% by weight of solids and less than 5% by weight of a surfactant. The wet coating weight was 12 g/m².

The Image Carriers D and E were each coated with a 4 µm thick, positive-working, tonable, photohardenable mixture and stored in the dark for 15 hours at 25° C. The samples were each toned with a cyan color sheet, and the resulting color density was measured with a densitometer (GRETAG D186). The measurement field was 25 mm².

Another Image Carrier E was prepared as described above. The coating was toned immediately and the color density measured as before. The measured color densities are shown in Table 3.

TABLE 3

| Image Carrier | Storage Time (hours) | Color Density |
|---|---|---|
| E | 15 | 1.18 |
| D | 15 | 1.09 |
| E | 0 | 1.19 |

The sample shows that Image Carrier E had the expected color density of 1.18, whereas Image Carrier D did not.

The color density of Image Carrier E remained constant, if the sample is stored in the dark for 15 hours at 25° C. between coating the positive-working, tonable photopolymer layer and toning.

What is claimed is:

1. An image carrier for making a color proof comprising, in order:
   (a) a substrate having an image-side surface;
   (b) a Layer A containing a polyolefin present on the image-side surface of the substrate; and
   (c) a Layer B containing at least one light absorbing pigment, at least one light reflecting white pigment, and at least one binder.

2. The image carrier according to claim 1, wherein the substrate is paper.

3. The image carrier according to claim 1 or 2, wherein the image carrier bears on its image-side surface at least one Layer C, which is farther away from the substrate than Layer B and is between 0.5 µm and 10 µm thick.

4. The image carrier according to claim 3, wherein Layer C is between 1 µm and 5 µm thick.

5. The image carrier according to claim 3 or 4, wherein Layer C contains at least one polymer and/or copolymer comprising at least 80% by weight of vinylidene chloride, butadiene, ethylene, propylene, and/or isoprene.

* * * * *